(12) United States Patent
Mezaki et al.

(10) Patent No.: US 8,133,815 B2
(45) Date of Patent: Mar. 13, 2012

(54) METHOD OF POLISHING COMPOUND SEMICONDUCTOR SUBSTRATE, COMPOUND SEMICONDUCTOR SUBSTRATE, METHOD OF MANUFACTURING COMPOUND SEMICONDUCTOR EPITAXIAL SUBSTRATE, AND COMPOUND SEMICONDUCTOR EPITAXIAL SUBSTRATE

(75) Inventors: Yoshio Mezaki, Itami (JP); Takayuki Nishiura, Itami (JP); Masahiro Nakayama, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1201 days.

(21) Appl. No.: 11/863,261

(22) Filed: Sep. 28, 2007

(65) Prior Publication Data

US 2008/0299350 A1   Dec. 4, 2008

(30) Foreign Application Priority Data

May 29, 2007   (JP) ................................ 2007-142109

(51) Int. Cl.
*H01L 21/302* (2006.01)
(52) U.S. Cl. .............. 438/692; 451/28; 451/36; 117/86; 438/689; 438/690; 438/691; 438/693
(58) Field of Classification Search .................. 428/141, 428/457; 451/28, 36; 117/913, 916, 952, 117/953, 954, 955, 86; 438/689–693
See application file for complete search history.

(56) References Cited

U.S. PATENT DOCUMENTS
2008/0292877 A1* 11/2008 Horie et al. ................... 428/336

FOREIGN PATENT DOCUMENTS

| EP | 1763071 A1 | * | 3/2007 |
| EP | 1830397 A2 | | 9/2007 |
| JP | S63-084872 A | * | 4/1988 |
| JP | 04-101782 | * | 4/1992 |
| JP | H04-101782 | * | 4/1992 |
| JP | H04-101782 A | * | 4/1992 |
| JP | H07-067666 B2 | * | 7/1995 |
| JP | H08-031779 A | | 2/1996 |
| JP | 2001-144056 A | * | 5/2001 |
| JP | 2002-025954 A | * | 1/2002 |
| JP | 2003-086553 A | * | 3/2003 |
| JP | 2003-100671 A | * | 4/2003 |

(Continued)

OTHER PUBLICATIONS

Japanese Office Action dated Nov. 17, 2009, which was received in connection with the Japanese priority document, Japanese Patent Appl. No. 2007-142109.*

*Primary Examiner* — Michael Kornakov
*Assistant Examiner* — Kenneth A Bratland, Jr.
(74) *Attorney, Agent, or Firm* — James W. Judge

(57) ABSTRACT

Compound-semiconductor-substrate polishing methods, compound semiconductor substrates, compound-semiconductor-epitaxial-substrate manufacturing methods, and compound semiconductor epitaxial substrates whereby oxygen superficially present on the substrates reduced. A compound semiconductor-substrate polishing method includes a preparation step (S10), a first polishing step (S20), and a second polishing step (S30). In the preparation step (S10), a compound semiconductor substrate is prepared. In the first polishing step (S20), the compound semiconductor substrate is polished with a chloric polishing agent. In the second polishing step (S30), subsequent to the first polishing step (S20), a polishing operation utilizing an alkaline aqueous solution containing an inorganic builder and having pH of 8.5 to 13.0 inclusive is performed.

4 Claims, 4 Drawing Sheets

FOREIGN PATENT DOCUMENTS

| | | | |
|---|---|---|---|
| JP | 3551229 B2 | * | 5/2004 |
| JP | 2004-207417 | * | 7/2004 |
| JP | 2004-207417 A | | 7/2004 |
| JP | 3680556 B2 | * | 5/2005 |
| JP | 2005-264057 | * | 9/2005 |
| JP | 2005-264057 A | * | 9/2005 |
| JP | 2005-264057 A | * | 9/2005 |
| JP | 2006-216788 A | | 8/2006 |

* cited by examiner

METHOD OF POLISHING COMPOUND SEMICONDUCTOR SUBSTRATE, COMPOUND SEMICONDUCTOR SUBSTRATE, METHOD OF MANUFACTURING COMPOUND SEMICONDUCTOR EPITAXIAL SUBSTRATE, AND COMPOUND SEMICONDUCTOR EPITAXIAL SUBSTRATE

BACKGROUND OF THE INVENTION

1. Technical Field

The present invention relates to methods of polishing compound semiconductor substrates, to the compound semiconductor substrates, to methods of manufacturing compound semiconductor epitaxial substrates, and to the compound semiconductor epitaxial substrates; more particularly the invention relates to compound-semiconductor-substrate polishing methods that reduce oxygen superficially present on the substrate, to the compound semiconductor substrates, to compound-semiconductor epitaxial-substrate manufacturing methods, and to the compound semiconductor epitaxial substrates.

2. Description of the Related Art

Compound semiconductor substrates have been widely used for semiconductor lasers, light emitting diodes (LEDs), and high-speed devices because they have luminescent properties and high electron mobility. Ordinarily, in compound-semiconductor-substrate manufacturing procedures polish is carried out. Methods of polishing compound semiconductor substrates are disclosed, for example, in Japanese Examined Pat. App. Pub. No. H07-67666, in Japanese Unexamined Pat. App. Pub. Nos. 2003-86553, 2001-144056, 2002-25954 and 2003-100671, and in Japanese Pat. Nos. 3680556 and 3551229.

Just-noted Japanese Examined Pat. App. Pub. No. H07-67666 discloses a technique whereby III-V compound semiconductor substrates are polished employing a polishing agent having as its principal components chloroisocyanuric acid, an alkali metal phosphate, and hydrosulfate. In Pub. No. H07-67666, polishing is done by superficially oxidizing a compound semiconductor substrate by means of the chloroisocyanuric acid contained in the polishing agent, and reductively removing the oxide by means of an alkali metal salt. An oxide film ends up being left on the substrate surface, however, because the chloroisocyanuric acid contained in the polishing agent is strongly oxidizing. Moreover, clearing away the oxide film in the post-polishing stages leading up to the final cleaning process is exceedingly difficult.

Disclosed in above-referenced Japanese Unexamined Pat. App. Pub. 2003-86553 is a technique of cleaning semiconductor crystal wafers with ultrapure water having a temperature of 15° C. or lower, directly after the end of a polishing process using an aqueous hypochlorite solution as the polishing solution. Because the polishing solution employed is a strongly oxidative aqueous hypochlorite solution having a pH of 8 to 10, superficial oxidation of the semiconductor-crystal wafer proceeds in the interval from after the end of the polishing until in the purified water the strongly oxidative polishing solution clinging to the wafer surface is replaced with the pure water. As a consequence, an oxide film forms thickly on the semiconductor-crystal wafer surface.

In above-referenced Japanese Unexamined Pat. App. Pub. 2001-144056, a technique of polishing semiconductor crystal wafers and, directly post-polish-completion, cleaning the wafers with an acidic aqueous solution having of pH 3 to 5 is disclosed. Even though the polishing solution is neutralized in the acidic aqueous solution, oxidizing potential remains following polish completion, because the polishing solution employed is a strongly oxidative aqueous hypochlorite solution having a pH of 8 to 10. Inasmuch as oxidation of the semiconductor-crystal wafer surface consequently proceeds even after polishing is completed, an oxide film forms thickly on the wafer surface.

Above-referenced Japanese Unexamined Pat. App. Pub. Nos. 2002-25954 and 2003-100671, and Pat. No. 3680556 disclose techniques of polishing semiconductor crystal wafers using as the polishing solution a mixture made blending a surfactant into a base polishing liquid. However, because oxide-film buildup cannot be sufficiently cleared away with a surfactant, an oxide film forms thickly on the wafer surface.

Aforementioned Japanese Pat. No. 3551229 discloses a technique whereby, when polishing of the front side of a semiconductor substrate is completed, an aqueous solution containing both a thickener and an oxidant is used to put a halt to the polishing reactions. However, the fact that the aqueous solution for stopping the polishing reactions contains an oxidant and the fact that the aqueous solution is employed post-polish mean that, with the oxidation reaction is not being halted, formation of oxide film on the substrate surface cannot be kept adequately under control.

With the techniques in above-referenced Japanese Examined Pat. App. Pub. No. H07-67666, in Japanese Unexamined Pat. App. Pub. Nos. 2003-86553, 2001-144056, 2002-25954 and 2003-100671, and in Japanese Pat. Nos. 3680556 and 3551229, polishing compound semiconductor substrates leads to an oxide film being formed superficially on the substrate.

For this reason, in situations in which to fabricate stacked devices, epitaxial layers are grown on a compound semiconductor substrate having an oxide film on its front side, the oxygen in the oxide film acts as impurities, wherein electrons passed into the devices to operate them end up being trapped by the oxygen present between the compound semiconductor substrate and the epitaxial layers. A consequent problem is that the number of electrons that reach the active layers drops, adversely affecting the device properties. A further problem is that a heavy presence of oxide film on the compound semiconductor substrate worsens the morphology of (the growth striations and defects in) epitaxial layers built onto the oxide film.

BRIEF SUMMARY OF THE INVENTION

Accordingly, an object of the present invention, brought about in order to resolve issues such as discussed above, is to make available a compound semiconductor-substrate polishing methods, compound semiconductor substrate, compound-semiconductor epitaxial-substrate manufacturing methods, and compound semiconductor epitaxial substrates, whereby oxygen superficially present on the substrates is reduced.

The present inventors, as a result of concerted investigations into reducing oxide film that, in polishing a compound semiconductor substrate, forms superficially on the substrate, came upon the following method.

Namely, the compound semiconductor-substrate polishing method of an aspect of the present invention comprises a preparation step, a first polishing step, and a second polishing step. In the preparation step, a compound semiconductor substrate is prepared. In the first polishing step, the compound semiconductor substrate is polished with a chloric polishing agent. In the second polishing step, subsequent to the first polishing step, a polishing operation utilizing an alkaline aqueous solution containing an inorganic builder and having pH of 8.5 to 13.0 inclusive is performed.

According to a compound semiconductor substrate polishing method of this aspect of the present invention, oxygen superficially present on the compound semiconductor substrate can be removed efficiently in the first polishing step because a reduction-reaction-employing polishing operation is performed—that is, to carry out the polishing operation an oxide film is formed on the substrate front side. Oxygen in the oxide film formed in the first polishing step superficially on the substrate can be removed in the second polishing step because the polishing with the alkaline aqueous solution containing the inorganic builder and having pH of 8.5 to 13.0 inclusive allows a reduction-reaction-employing polishing operation to be carried out. Therefore, the oxygen present on the front side of the compound semiconductor substrate can be reduced.

It should be understood that the chloric polishing agent means a solution containing chlorate ions ($ClO^-$), such as hypochlorite, and means a polishing agent containing a solid substance that generates the chlorate ion ($ClO^-$) when it is dissolved in chloroisocyanuric acid aqueous solution.

In the compound semiconductor-substrate polishing method, it is preferable is that an inorganic builder with a concentration of 0.05% to 2.0% inclusive is used in the second polishing step.

Using the inorganic builder with a concentration of 0.05% or more shortens time required to remove the oxygen in oxide present on the substrate front side. Using an inorganic builder with a concentration of 2.0% or less enables controlling readily the time required to remove the oxygen in the oxide superficially present on the substrate.

In the compound semiconductor-substrate polishing method, it is preferable is that the inorganic builder added in the second polishing step be composed of at least one substance selected from the group consisting of: sodium hydrate, sodium carbonate, sodium hydrogen carbonate, sodium sesquicarbonate, sodium metasilicate, sodium sesquisilicate, sodium orthosilicate, sodium orthophosphate, sodium pyrophosphate, sodium tripolyphosphate, sodium tetraphosphate, sodium hexametaphosphate, and sodium sulfate.

Adding the inorganic builder allows the use of an inorganic builder containing no organic matter, making it possible to carry out wastewater treatment smoothly after the second polishing step so as to ease the burden on the environment. Moreover, with this inorganic builder, the alkaline aqueous solution pH is readily adjusted so as to be in a higher pH range.

In the compound semiconductor-substrate polishing method, it is preferable that the compound semiconductor substrate prepared in the preparation step be composed of gallium arsenide (GaAs), indium phosphide (InP), indium antimonide (InSb), gallium antimonide (GaSb), indium arsenide (InAs), gallium nitride (GaN), indium nitride (InN), or aluminum nitride (AlN). Preparing such a substrate enables the use of a high-performance compound semiconductor substrate.

In the compound semiconductor-substrate polishing method, it is preferable is that the first polishing step and second polishing step are carried out as a final-stage process of planarizing the compound semiconductor substrate.

Carrying the first and second polishing steps out as a final-stage planarization process enables the reduction of oxygen in oxide film superficially present on the substrate, in such a way that this process can be preferably employed in a compound semiconductor substrate surface-treating method, whereby impurity concentration is lowered.

It should be understood that the final-stage planarization process means the last-implemented process among the polishing steps in which impurities present on the front side of the compound semiconductor substrate are planarized to the level of atomic scale corrugations.

A compound semiconductor substrate in another aspect of the present invention is a compound semiconductor substrate produced by the above compound semiconductor substrate polishing method, wherein the substrate has a front side on which oxygen content measures 14 atomic % or less by X-ray photoelectron spectroscopy (XPS).

A compound semiconductor substrate in another aspect of the present is produced by the foregoing compound semiconductor substrate polishing method, such that oxygen in the oxide film superficially formed on the substrate is removed. Therefore, in implementations in which epitaxial layers are formed on the compound semiconductor substrate having a front side on which oxygen content has been lowered as described above, and such epitaxial layers are employed as devices, the electrical properties of the devices and the morphology of the epitaxial layer can be prevented from being adversely affected by oxygen film formation.

It should be understood that the photoelectron takeoff angle in the XPS is defined at a low angle of 10° to ensure the accuracy of analyzing the compound-semiconductor-substrate surface.

In the compound semiconductor substrate, it is preferable that the substrate has the front side on which RMS surface roughness measures 0.2 nm or less by atomic force microscopy (AFM) with a view field of 0.2 μm square or less, and with a pitch of 0.4 nm or less; and it is more preferable that the RMS roughness measure 0.1 nm or less.

A compound semiconductor substrate having the flat front side on which the atomic scale corrugations have been decreased as described above can be produced because the oxygen in the oxide film formed on the substrate front side has been reduced. Therefore, in employing the compound semiconductor substrate for devices, the electrical properties of the device and the morphology of the epitaxial layer can be prevented from being adversely affected.

Herein, the RMS roughness is measured in conformity with JIS B0601.

A compound semiconductor epitaxial-substrate manufacturing method in a further aspect of the present invention comprises a step of carrying out the compound semiconductor-substrate polishing method, and a post-treatment step of, subsequent to the step of carrying out the polishing method, forming on the front side of the compound semiconductor substrate the epitaxial layer.

This manufacturing method enables manufacturing a compound semiconductor epitaxial substrate in which oxygen present in the interface between the front side of the compound semiconductor substrate and the epitaxial layer has been reduced.

A compound semiconductor epitaxial substrate of yet another aspect of the present invention is a compound semiconductor epitaxial substrate manufactured by the above compound semiconductor epitaxial-substrate manufacturing method, and is provided with the compound semiconductor substrate, and with the epitaxial layer formed on it, wherein oxygen concentration in the interface between the compound semiconductor substrate and the epitaxially grown payer is $3.5 \times 10^{17}$ atoms/cm² or less.

Providing the compound semiconductor epitaxial substrate of yet another aspect of the present invention with the compound semiconductor substrate having the front side on which oxygen has been reduced enables the production of a compound semiconductor epitaxial substrate in which oxygen present in the interface between the front side of the compound semiconductor substrate and the epitaxial layer has been reduced as described above. In particular, with an epitaxial layer having electrical properties different from the formed compound semiconductor substrate, the difference in electrical properties between the compound semiconductor substrate and the epitaxial layer is kept from being narrowed by oxygen, so that the properties of the device are further prevented from being adversely affected.

According to a compound semiconductor substrate polishing method of an aspect of the present invention, removing in the second polishing step oxygen in the oxide film formed on the substrate front side makes it possible to produce compound semiconductor substrates in which oxygen present on the substrate front side has been reduced.

From the following detailed description in conjunction with the accompanying drawings, the foregoing and other objects, features, aspects and advantages of the present invention will become readily apparent to those skilled in the art.

DETAILED DESCRIPTION OF THE INVENTION

Figure 1:
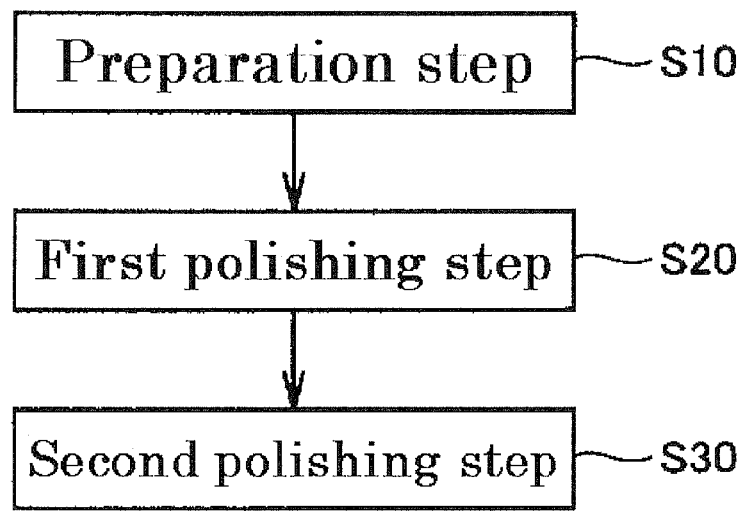
FIG. 1 is a flow chart representing a compound-semiconductor-substrate polishing method in Embodiment Mode 1 of the present invention.

Hereinafter, referring to the figures, embodiments and examples of the present invention will be described. It should be understood that in the drawings accompanying the present description, identical or equivalent features are labeled with identical reference marks, and their explanation will not repeated.

Embodiment Mode 1

FIG. 1 is a flow chart representing a method of polishing a compound semiconductor substrate in Embodiment Mode 1 of the present invention. With reference to FIG. 1, an explanation of the compound semiconductor substrate polishing method will be made.

First, as represented in FIG. 1, a preparation step (S10) is carried out, in which a compound semiconductor substrate is prepared. In the preparation step (S10), the compound semiconductor substrate composed of gallium arsenide, indium phosphorus, indium antimony, gallium antimony, indium arsenide, gallium nitride, indium nitride, and aluminum nitride is preferably prepared. It should be understood that the compound semiconductor substrate to be prepared may be a bulk crystal or a thin film formed on a substrate composed of, for example, the bulk crystal.

Next, as represented in FIG. 1, a first polishing step (S20) is carried out, in which the compound semiconductor substrate is polished with a chloric polishing agent. In the first polishing step (S20), redox-reaction-employing polishing is performed.

Specifically, although as the chloric polishing agent, for example, a polishing agent containing sodium hypochlorite or that containing sodium dichlorisocyanurate aqueous solution can be used, a polishing agent created by dissolving in water the solid polishing agent in which inorganic salt is added to the sodium dichlorisocyanurate aqueous solution is preferably used because of solution stability and polishing rate stabilization.

Additionally, at least one kind of additive, such as colloidal silica, may be further added to the chloric polishing agent.

Figure 2:
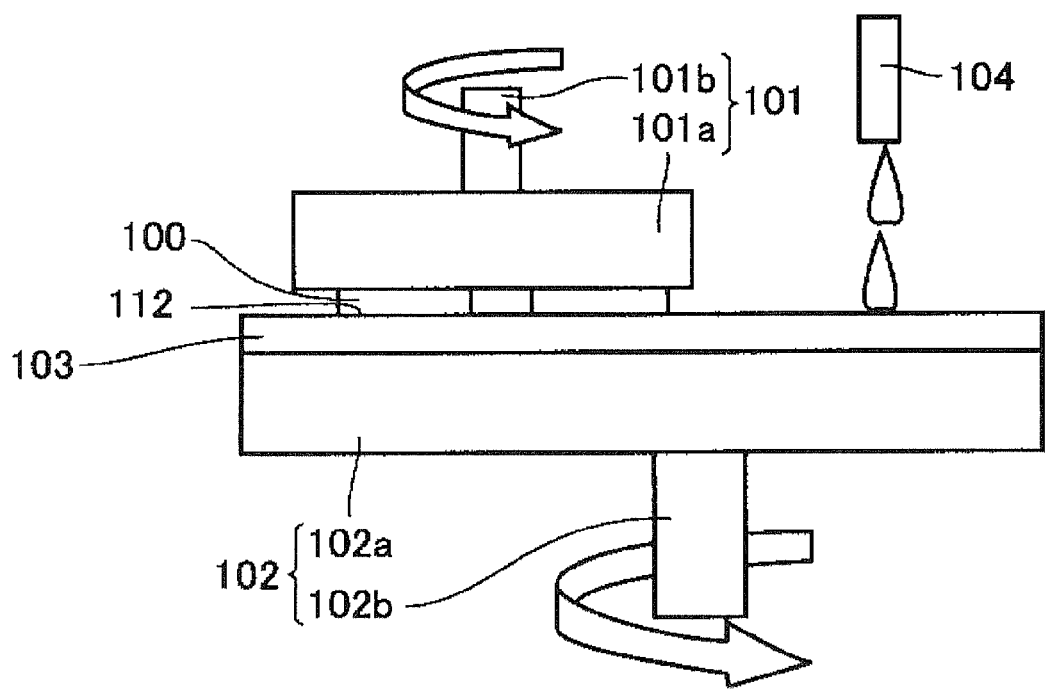
FIG. 2 is a diagram of a polishing device utilized in the first and second polishing steps in Embodiment Mode 1 of the present invention.

Moreover, in the polishing step (20), the polishing is performed employing, for example, a polishing device as illustrated in FIG. 2.

It should be understood that the FIG. 2 illustrates the polishing device used in the first and second polishing steps of Embodiment Mode 1. As illustrated in FIG. 2, the polishing device employed in the embodiment modes of the present invention comprises a substrate holder 101, a rotary platen 102, a polishing cloth 103, and a polishing agent supplying unit 104. The substrate holder 101 includes a pressing head 101a, and a shaft 101b that is connected to the pressing head 101a so as to rotate it. The rotary platen 102 includes a disc-shaped part 102a, and a shaft 102b that is connected to the center of the bottom face of the disk part 102a so as to rotate it. The polishing cloth 103 is affixed to the top face of the rotary platen 102. As the polishing cloth 103, a suede polishing cloth is used, for example. The polishing agent supplying unit 104 that supplies a chloric polishing agent is disposed over the rotary platen 102.

In carrying out the first polishing step (S20), a compound semiconductor substrate 100 is attached to the bottom face of the pressing head 101a, with a front side 112 of the compound semiconductor substrate 100 being arranged oppositely to the polishing cloth 103. And the pressing head 101a is moved down to apply predetermined pressure to the compound semiconductor substrate 100. Subsequently, the pressing head 101a and disk-shaped part 102a are rotated in the same orientation (the orientation of the arrow in FIG. 2), while the chloric polishing agent is being supplied from the polishing agent supplying unit 104 to the polishing cloth 103.

It should be understood that the substrate holder 101 and rotary platen 102 may be rotated respectively in one orientation and in another, and one of the substrate holder 101 and rotary platen 102 may be rotated with another of them being fixated. Moreover, the first front side 112 of the compound semiconductor substrate 100 may be polished (single sided polishing may be adopted), and both of the first front side and a second front side may be polished (double sides polishing may be adopted).

In the first polishing step (S20), using the chloric polishing agent enables removing impurities present on the front side of the compound semiconductor substrate in a short time while an oxide film is being formed on the substrate front side. The first polishing step (S20), however, causes the formation of the oxide film on the front side of the compound semiconductor substrate.

Next, as represented in FIG. 1, subsequent to the first polishing step (S20), a second polishing step (S30) is carried out, in which polishing is performed with alkaline aqueous solution containing an inorganic builder and having pH of 8.5 to 13.0 inclusive. In the second polishing step (S30), reduction-reaction-employing employing polishing is performed.

Although pH of the alkaline aqueous solution used in the second polishing step (S30) is between 8.5 and 13.0 inclusive, it is preferable that the pH is 9.4 to 12.5 inclusive, and it is more preferable that the pH is 10.5 to 12.5 inclusive. When the pH is 8.5 or less, oxygen in the oxide film formed in the first polishing step (S10) is not adequately removed. Making the pH 9.4 or more enables the oxygen to be adequately removed by dissolving the oxides in the oxide film present on the substrate front side. Bringing the pH to 10.5 or more enables more adequate removal of the oxygen present on the substrate front side. On the other hand, when pH exceeds 13.0, scratches make corrugations on the front side of the compound semiconductor substrate severe. Making the pH 12.5 or less keeps the corrugations on the substrate front side from becoming severer. Bringing the pH to 10.3 or less further keeps the corrugations on the substrate front side from becoming severer.

In the second polishing step (S30), the inorganic builder with a concentration of 0.05% to 2.0% inclusive is preferably used, and more preferably, the inorganic builder with a concentration of 0.5% to 1.3% inclusive is used. Using the inorganic builder with a concentration of 0.05% or more shortens time required to remove the oxides present on the substrate front side. Using the inorganic builder with a concentration of 0.5% or more further shortens the time required to remove the oxides present on the substrate front side. On the other hand, using the inorganic builder with a concentration of 2.0% or less facilitates the control of the second polishing step (S30) because the time required to remove the oxides present on the substrate front side is not shortened excessively. Using the inorganic builder with a concentration of 1.3% or less further facilitates the control of the second polishing process (S30).

In the second polishing step (S30), the inorganic builder composed of at least one kind of substance selected from a group consisting of sodium hydrate, sodium carbonate, sodium hydrogen carbonate, sodium sesquicarbonate, sodium metasilicate, sodium sesquisilicate, sodium orthosilicate, sodium orthophosphate, sodium pyrophosphate, sodium tripolyphosphate, sodium tetraphosphate, sodium hexametaphosphate, and sodium sulfate is preferably added. Such an inorganic builder contains no organic matter, so that wastewater treatment subsequent to the second polishing step (A30) is facilitated and a lesser burden is exerted on the environment. Moreover, the alkaline aqueous solution pH can be adjusted smoothly to within above pH range with the inorganic builder having a concentration in above preferable range because the solution of this inorganic builder in water has pH of 7 to 13.

The alkaline aqueous solution, which may be adjusted with the inorganic builder to have alkaline pH of 8.5 to 13.0 inclusive, is preferably adjusted by adding to ultrapure water sodium carbonate and other alkaline chemicals so as to have alkaline pH of 8.5 and 13.0 inclusive. Using ultrapure water protects the front side of the compound semiconductor substrate from being contaminated by metals and other impurities. Moreover, in a situation in which alkaline pH is 8.5 to 13.0 inclusive, the alkaline aqueous solution may have included an oxidant with a weight ratio of polishing agent solid constituent in the range of 3% or less. From the perspective of efficiently removing oxygen, however, no oxidant is preferably added. When there is no addition of oxidant, polishing employing only reduction-reaction can be performed in the second polishing step (S30).

Furthermore, the second polishing step (S30) can be carried out, for example, by means of the polishing device, as illustrated in FIG. 2, employed in the first polishing step (S20). In carrying out the second polishing step (S30) with this device, the alkaline aqueous solution containing the inorganic builder and having pH of 8.5 to 13.0 inclusive can be supplied to the front side 112 of the compound semiconductor substrate 100 by, for example, a polishing agent supplying unit similar to, or different from, the abrasive providing portion 104, or by another polishing device.

The temperature of the polishing agent used in the first and second polishing steps (S20, S30) is not particularly limited, but it is preferably defined at room temperature. The reason is that defining it at room temperature simplifies devices for carrying out the first and second polishing steps (S20, S30).

Figure 3:
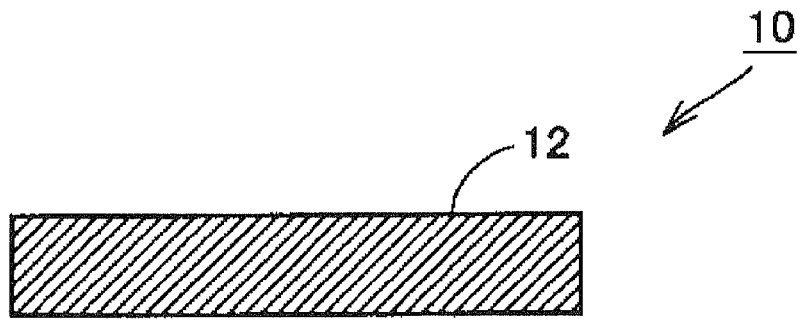
FIG. 3 is a sectional diagram illustrating a compound semiconductor substrate in Embodiment Mode 1 of the present invention.

A compound semiconductor substrate 10, as illustrated in FIG. 3, in the embodiment modes of the present invention, can be produced by carrying out these steps (S10 to S30). It should be understood that FIG. 3 is a cross-sectional view illustrating a compound semiconductor substrate in Embodiment Mode 1 of the present invention.

As illustrated in FIG. 3, oxygen content in the front side 12 of the compound semiconductor substrate 10 measures 14 atomic % or less by XPS. It is preferable is that the oxygen content is 11 atomic % or less, and it is more preferable that the oxygen content is 10 atomic % or less. Making the oxygen content 14 atomic % or less prevents electrical properties of a device produced by carrying out the post-treatment step to be described hereinafter from being adversely affected. Bringing the oxygen content to 11 atomic % or less further prevents the electrical properties of the device produced by carrying out the post-treatment step (S40) to be described hereinafter from being adversely affected. Although the lower oxygen content, the more preferable, the oxygen content is 5 atomic % or more because the first and second polishing steps (S20, S30) can simply carried out.

It should be understood that the oxygen content is measured by XPS in which a photoelectric peak inherent to oxygen generated by radiating X-ray to the front side of the compound semiconductor substrate is detected and analyzed to nondestructively measure the front side condition.

Furthermore, the compound semiconductor substrate 10 preferably has the front side 12 whose RMS roughness measures 0.2 nm or less by an atomic force microscope with a view field of 0.2 μm square or less, and with a pitch of 0.4 nm or less, and more preferably has the front side 12 whose RMS roughness is 0.1 nm or less. Making the RMS roughness 0.2 nm or less reduces atomic scale corrugations on the front side 12, improving the electrical properties of the device produced by carrying out the post-treatment step (S40) that will be described hereinafter. Bringing the RMS roughness to 0.1 nm of less further improves the electrical properties of the device produced by carrying out the post-treatment step (S40). On the other hand, bringing the RMS roughness to 0.03 nm or more provides the current possible RMS.

As just described, the compound semiconductor-substrate polishing method in Embodiment Mode 1 of the present invention comprises the second polishing step (S30) in which subsequent to the first polishing step (S20) of polishing the compound semiconductor substrate with the chloric polishing agent, polishing is performed with the alkaline aqueous water containing the inorganic builder and having pH of 8.5 to 13.0 inclusive. Concerted investigations led the inventors to discover that the alkaline component and inorganic builder have a synergistic effect of removing oxygen. That is, reduction-reaction-employing polishing is performed in the first polishing step (S20), and reduction-reaction-employing polishing is performed in the second polishing step (S30), to dissolve oxides in the oxide film formed in the first polishing step (S20) on the substrate front side so that element, in the oxide, composing the compound semiconductor substrate is trapped and oxygen in the oxides is removed. Consequently, the oxygen present on the front side of the compound semiconductor substrate is reduced. As a result, compound semiconductor substrate having the front side 12 whose oxygen content and RMS roughness have been reduced can be produced.

Embodiment Mode 2

Figure 4:
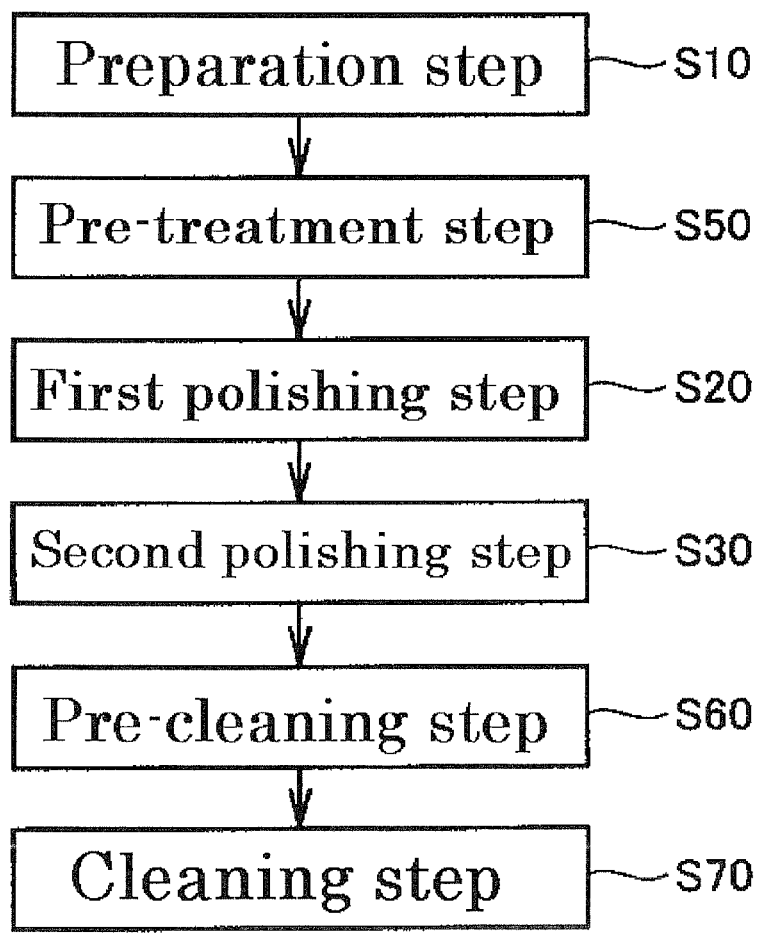
FIG. 4 is a flow chart representing a compound-semiconductor-substrate surface-treating method in Embodiment Mode 2 of the present invention.

FIG. 4 is a flow chart representing a method of surface treating the compound semiconductor substrate in Embodiment Mode 2 of the present invention. Referring to FIG. 4, the compound semiconductor-substrate surface treating method in Embodiment Mode 2 of the present invention will be described. As represented in FIG. 4, the compound semiconductor-substrate surface treating method in Embodiment Mode 2 has steps similar to those of the compound semiconductor-substrate polishing method in Embodiment Mode 1, but differs only in comprising a pre-treatment step (S50), pre-cleaning step (S60), and a cleaning step (S70).

First, as illustrated in FIG. 4, the preparation step (S10) of preparing the compound semiconductor substrate is carried out as in Embodiment Mode 1.

Next, prior to the first and second polishing steps (S20, S30), pre-treatment step (S50) is carried out, in which the compound semiconductor substrate is polished. In the pre-treatment step (S50), before the first and second polishing steps (S20, S30) are carried out, the front side of the compound semiconductor substrate is treated to a predetermined level. It should be understood that the predetermined level means a condition for making the oxygen content and surface roughness of the substrate front side similar to, or lower than, those in Embodiment Mode 1, after the first and second polishing steps (S20, S30). In the pre-treatment step (S50), for example, a step of performing double sides polishing and a step of performing single sided polishing are successively carried out.

Next, as in Embodiment Mode 1, the first polishing step (S20), and subsequently the second polishing step (S30) are carried out. The first and second polishing steps (S20, S30) are carried out as a final-stage process of planarizing the compound semiconductor substrate.

After that, a pre-cleaning step (S60) is carried out, in which the compound semiconductor substrate is cleaned with alkaline cleaning solution. In the pre-cleaning step (S60), for example, cleaning solution containing one selected from a group consisting of aqueous sodium hydroxide (NaOH), aqueous potassium hydroxide (KOH), aqueous ammonia, and solution including amines is used. Carrying out the pre-cleaning step (S60) has effect on the removal of particles on the substrate front side. It should be understood that this step (S60) may be omitted.

Next, the cleaning step (S70) is performed, in which the compound semiconductor substrate is cleaned with acidic cleaning solution. The cleaning step (S70) comprises a chemical cleaning step of cleaning the substrate front side, for example, with the cleaning solution adjusted with oxidant so as to be acidic, and added with oxidant as necessary, a wash step of cleaning the compound semiconductor substrate with pure water, and a dry step of drying the compound semiconductor substrate. In the wash step, vibrations (or shaking) are applied to the cleaning solution by using an ultrasonic device, as illustrated in FIG. 5, for example.

Figure 5:
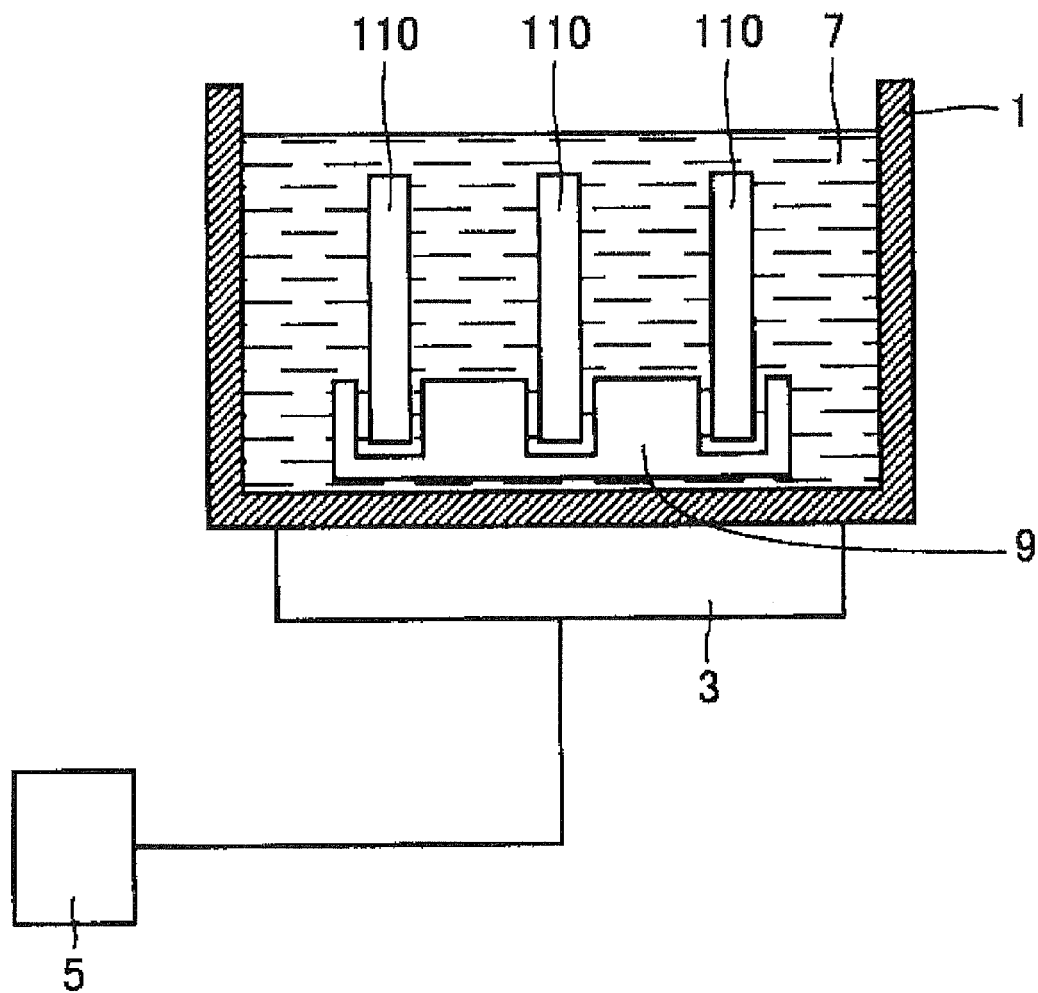
FIG. 5 is a schematic sectional diagram of an ultrasonic device employed in a wash step.

FIG. 5 is a schematic cross-sectional view illustrating the ultrasonic device used in the wash step. As illustrated in FIG. 5, the ultrasonic device is provided with a cleaning bath 1 that contains cleaning solution 7 as wash, with an ultrasonic wave generating unit 3 disposed on a bottom surface of the cleaning bath 1, and with a control unit 5 that is connected to the ultrasonic wave generating unit 3 to control it. The cleaning solution 7 is contained in the cleaning bath 1. In addition, a holder 9 for holding a plurality of compound semiconductor substrates 110 is kept immersed in the cleaning solution 7. The plurality of the compound semiconductor substrates 110 that are cleaned is held in the holder 9. The ultrasonic wave generating unit 3 is disposed on the bottom surface of the cleaning bath 1.

When the compound semiconductor substrates are cleaned in the wash step, the predetermined cleaning solution 7 is provided into the cleaning bath 1 as illustrated in FIG. 5, and together with the holder 9, the compound semiconductor substrates 110 held in the holder 9 are immersed into the cleaning solution 7. In this manner, the surfaces of the compound semiconductor substrates 110 are cleaned with the cleaning solution 7.

Moreover, when the substrates are cleaned, ultrasonic waves may be generated by controlling the ultrasonic wave generating unit 3 with the control unit 5. As a result, the ultrasonic waves are applied to the cleaning solution 7. The ultrasonic waves vibrate the cleaning solution 7, enhancing the effect of removing impurities or particles from the compound semiconductor substrates 110. Furthermore, with the cleaning bath 1 being disposed on a shakable member such as XY stage, the cleaning solution 7 in the cleaning bath 1 may be stirred (shaken) by shaking the member to shake the cleaning bath 1. Alternatively, the cleaning solution may be stirred (shaken) by, together with the holder 9, shaking by hand the compound semiconductor substrates 110. Shaking by hand also enhances the effect of removing impurities or particles from the compound semiconductor substrates 110, as in the manner in which the ultrasonic waves are applied.

Carrying out these steps (S10 to S70) makes it possible to produce the compound semiconductor substrate 10, as illustrated in FIG. 3, having the front side 12 on which oxygen has been reduced as in Embodiment mode 1.

As just described, according to the compound semiconductor-substrate surface treating method in Embodiment Mode 2 of the present invention, the first and second polishing steps (S20, S30) are carried out as the final planarization step. Therefore, the compound semiconductor substrate in which oxygen present on the substrate front side has been reduced can be produced.

Embodiment Mode 3

Figure 6:
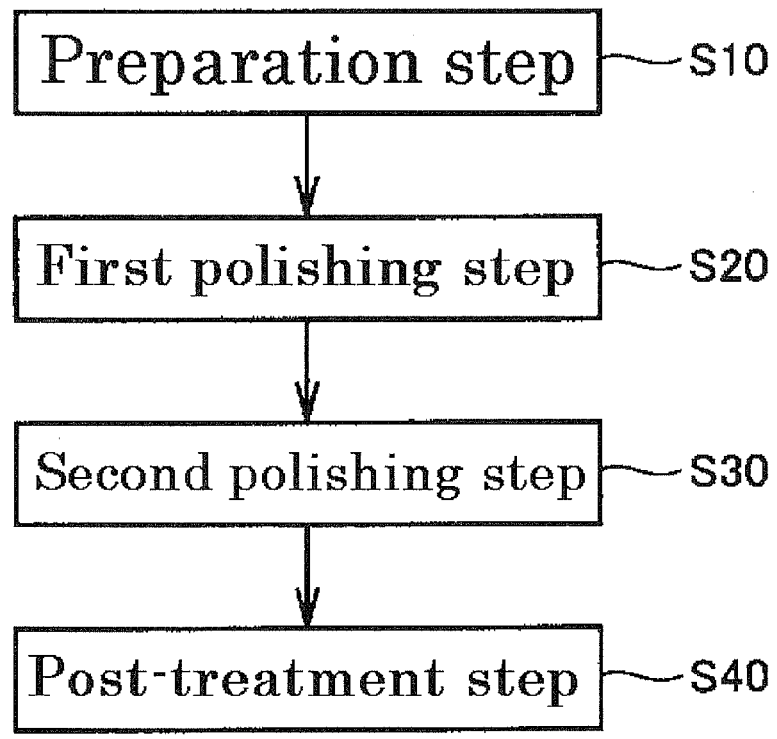
FIG. 6 is a flow chart representing a compound-semiconductor-epitaxial-substrate manufacturing method in Embodiment Mode 3 of the present invention.

FIG. 6 is a flow chart representing a compound semiconductor epitaxial-substrate manufacturing method of the Embodiment Mode 3 of the present invention. Referring to FIG. 6, the compound semiconductor epitaxial-substrate manufacturing method will be described. The compound semiconductor epitaxial-substrate manufacturing method comprises basically steps similar to those of the compound semiconductor substrate polishing method in Embodiment Mode 1, but differs only in carrying out the post-treatment step (S40) of forming on the front side 12 of the compound semiconductor substrate 10 an epitaxial layer 21.

Specifically, first, as illustrated in FIG. 6, the compound semiconductor substrate polishing method (S10 to S30) is carried out.

Next, the post-treatment step (S40) is carried out, in which the epitaxial layer is formed on the front side of the compound semiconductor substrate 10. It should be understood that the compound semiconductor substrate used in the post-treatment step (S40) may has undergone the first and second polishing steps (S20, S30), and is not particularly limited to the compound semiconductor substrate 10 produced by the compound semiconductor substrate polishing method (S10 to S30) in Embodiment Mode 1. For example, the compound semiconductor substrate produced by carrying or the compound semiconductor-substrate surface treating method in Embodiment Mode 2 may be used.

Figure 7:
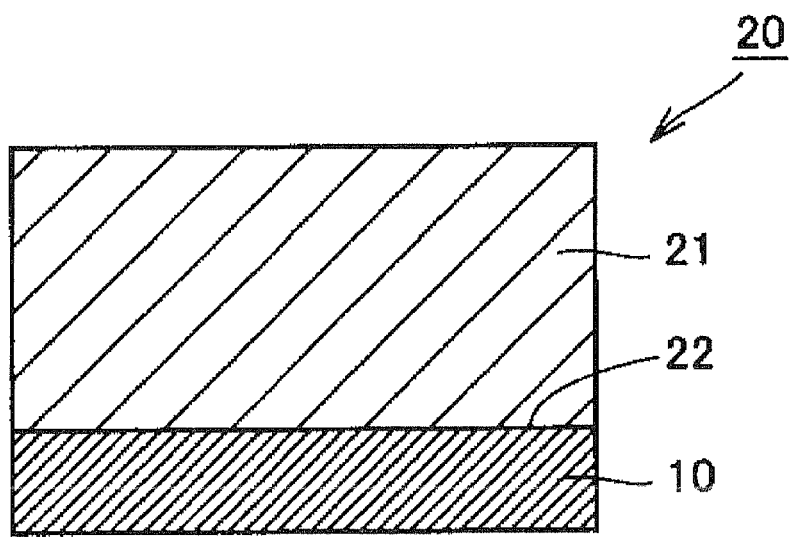
FIG. 7 is a sectional diagram illustrating a compound semiconductor epitaxial substrate in Embodiment Mode 3 of the present invention.

In the post-treatment step (S40), film forming process is carried out, in which, for example, a predetermined epitaxial layer that is formed on the front side 12 of the compound semiconductor substrate 10 to manufacture a compound semiconductor epitaxial substrate 20 as illustrated in FIG. 7. Also, a plurality of devices is preferably formed employing the compound semiconductor epitaxial substrate 20. In forming the devices employing the epitaxial substrate 20, a dividing step in which dicing is performed is carried out in order to divide the compound semiconductor epitaxial substrate 20 into the individual devices after it is formed on the front side 12 of the compound semiconductor substrate 10. As a result, the devices provided with the compound semiconductor epitaxial substrate 20 are produced. Such devices are mounted to, for example, a lead frame. Subsequently, a wire bonding step is carried out to produce the semiconductor equipment employing these devices.

The compound semiconductor epitaxial substrate 20 as illustrated in FIG. 7 is manufactured by carrying out these steps (S10 to S40). FIG. 7 is a cross-sectional view illustrating the compound semiconductor epitaxial substrate in Embodiment Mode 3 of the present invention.

As illustrated in FIG. 7, the compound semiconductor epitaxial substrate 20 comprises the compound semiconductor substrate 10, and an epitaxial layer 21 formed on the compound semiconductor substrate 10. Oxygen density in an interface 22 between the compound semiconductor substrate 10 and the epitaxial layer 21 is preferably $3.5\times10^{17}$ atoms/cm$^2$ or less, and is more preferably $2.9\times10^{17}$ atoms/cm$^2$ or less. Making the oxygen density $3.5\times10^{17}$ atoms/cm$^2$ or less prevents electrons transferring between the compound semiconductor substrate 10 and the epitaxial layer 21 from being trapped by oxygen, eliminating a factor that prevents the electrons from inflowing an active layer of a longitudinal device to keep the properties of the device from being adversely affected. Bringing the oxygen density to $2.9\times10^{17}$ atoms/cm$^2$ or less further prevents the properties of the device from being adversely affected.

As just described, according to the method of manufacturing the compound semiconductor epitaxial substrate 20 in Embodiment Mode 3, electrons transferring between the compound semiconductor substrate 10 and the epitaxial layer 21 can be prevented from being trapped by oxygen because the oxygen density in the interface 22 between the compound semiconductor substrate 10 and the epitaxial layer 21 is reduced. Therefore, effectively increasing electrons flowing into the active layer of the longitudinal device prevents the properties of the device from being adversely affected.

Embodiment 1

In order to confirm effects of the compound semiconductor substrate according to the present invention, the following samples were prepared, and the front side of the compound semiconductor substrate after the first or second polishing step, and the interface between the compound semiconductor substrate and the epitaxial layer after the post-treatment step, were examined.

PRESENT INVENTION EXAMPLES 1 THROUGH 6

The compound semiconductor-substrate polishing methods in Present invention examples 1 through 6 were in accordance with the compound semiconductor epitaxial-substrate manufacturing method in Embodiment Mode 3.

Specifically, GaAs semiconductor crystal ingot was sliced into compound semiconductor substrates in the preparation step (S10).

Next, in the pre-treatment step (S50), the compound semiconductor substrates were lapped with abrasive, and were flattened, to bond them precisely to a ceramics plate. The compound semiconductor substrates were polished with a solution mixture of colloidal silica and chlorine-based polishing solution.

Next, hypochlorous acid was used as a chloric polishing agent in the first polishing step (S20). Additionally, the compound semiconductor substrates were polished on the polishing cloth 103 composed of the suede polishing cloth by using the polishing device as illustrated in FIG. 2.

Next, supply of the chloric polishing agent was stopped in the second polishing step (S30), and immediately after that, alkaline aqueous solution having pH tabulated in the following table, and in which sodium pyrophosphate, sodium carbonate and sodium sulfate are dissolved, was supplied as the inorganic builder via the polishing agent supplying unit 104 to the polishing cloth 103 to perform polishing on the polishing cloth 103 for thirty seconds. It should be understood that pH of this polishing solution was measured by a pH concentration meter corrected by standard solutions having pH 6.97 and pH 4.0.

Next, the front sides of the compound semiconductor substrates were cleaned with ultrapure water, and then were de-bonded from the ceramics plate, in the pre-cleaning step (S60).

Next, the front sides of the compound semiconductor substrates were cleaned with choline (amine), and then dried, in the cleaning step (S70). Through these steps, the compound semiconductor substrates in Present Invention Examples 1 to 6 were produced.

Next, in the post-treatment step (S40), epitaxial growth was performed employing the compound semiconductor substrates by means of a metal organic chemical vapor deposition (MOCVD) device. In Present Invention Examples 1 through 6, after a GaAs layer was grown on the front sides of the compound semiconductor substrates so as to be 0.05 μm, a AlGaAs layer was grown so as to be 2 μm, on which a GaAs layer was grown so as to be 0.05 μm. As a result, the compound semiconductor epitaxial substrates in Present Invention Examples 1 through 6 were produced.

COMPARATIVE EXAMPLE 1

Comparative example 1 was basically furnished with the compound semiconductor epitaxial-substrate manufacturing method similar to that in Present Invention Examples 1 through 6, but differs in that the second polishing step (S30) was not carried out.

COMPARATIVE EXAMPLE 2

Comparative example 2 was basically furnished with the compound semiconductor epitaxial-substrate manufacturing method similar to that in Present Invention Example 6, but differs in that pH was made 5.1 in the second polishing step (S30).

Measuring Method

As for the compound semiconductor substrates in Present Invention Examples 1 through 6, and in Comparative Examples 1 and 2, oxygen content on the substrate front sides were measured by XPS, and additionally RMS roughness was measured by AFM with a view field of 0.2 μm square or less, and with a pitch of 0.4 nm or less. As AFM, Dimension 3000, produced by Veeco, was used with measurement mode in tapping. The results were tabulated in the table below.

Additionally, as for the compound semiconductor epitaxial substrate in Present Invention Examples 1 though 6 and in Comparative Examples 1 and 2, oxygen density in the interfaces between the compound semiconductor substrates and the epitaxial layers was measured by SIMS, and additionally surface flatness of the substrate front sides was calculated by irradiating laser to the substrate front sides to measure scattered light intensity. It should be understood that the measured scattered light intensity was converted into the flatness because there was the correlation that the lower the scattering intensity, the higher the flatness. Furthermore, emission intensity of the compound semiconductor substrates was measured by making a photoluminescence (PL) measurement in which crystal faults and impurities could be measured nondestructively. It should be understood that presence of the crystal faults and impurities lowers the emission intensity. The results were tabulated in the following table.

TABLE

|  | 2nd polishing step | | Compound semiconductor substrate | | Compound semiconductor epitaxial substrate | | |
| --- | --- | --- | --- | --- | --- | --- | --- |
|  | pH | Conc. (%) | RMS roughness (nm) | Oxygen content (atomic %) | Oxygen density (atoms/cm$^2$) | Flatness (ppm) | PL intensity |
| Present Invent. Ex. 1 | 8.5 | 0.05 | 0.2 | 14 | $3.5 \times 10^{17}$ | 1.5 | 58 |
| Present Invent. Ex. 2 | 10.7 | 1.3 | 0.1 | 11 | $3.2 \times 10^{17}$ | 1.2 | 55 |
| Present Invent. Ex. 3 | 12.5 | 0.5 | 0.1 | 10 | $2.9 \times 10^{17}$ | 1.1 | 59 |
| Present Invent. Ex. 4 | 13.0 | 2.0 | 0.2 | 12 | $3.1 \times 10^{17}$ | 1.3 | 56 |
| Present Invent. Ex. 5 | 10.3 | 0.9 | 0.1 | 12 | $3.2 \times 10^{17}$ | 1.2 | 57 |
| Present Invent. Ex. 6 | 9.4 | 1.1 | 0.2 | 14 | $3.4 \times 10^{17}$ | 1.5 | 52 |
| Compar. Ex. 1 | — | 0 | 0.4 | 16 | $4.0 \times 10^{17}$ | 4.1 | 45 |
| Compar. Ex. 2 | 5.1 | 0.5 | 0.4 | 16 | $4.1 \times 10^{17}$ | 4.8 | 40 |

Measurement Results

As for the front sides of the compound semiconductor substrates in Present Invention Examples 1 through 6, the oxygen content was greatly reduced, and the RMS roughness was also greatly lowered, compared with those in Comparative Examples 1 and 2, as shown in the table.

Furthermore, as for the interface between the compound semiconductor substrate and epitaxial layer of the compound semiconductor epitaxial substrate in Present Invention Examples 1 through 6, oxygen density is very low, flatness is greatly reduced, and PL intensity is improved, compared with those in Comparative Examples 1 and 2.

As just described, according to Embodiment 1 of the present invention, it has been shown that carrying out the first and second polishing steps (S20, S30) enables the reduction of oxygen present on the front side of a compound semiconductor substrate.

The presently disclosed embodiments and implementation examples should in all respects be considered to be illustrative and not limiting. The scope of the present invention is set forth not by the forgoing description but by the scope of the patent claims, and is intended to include meanings equivalent to the scope of the patent claims and all modifications within the scope.

What is claimed is:

1. A compound-semiconductor-substrate polishing method comprising:
    a preparation step of preparing a gallium arsenide substrate;
    a pretreatment step of polishing at least a front side of the gallium arsenide substrate with a solution mixture of colloidal silica and a chlorine-based polishing solution;
    a first polishing step, subsequent to the pretreatment step, of carrying out on at least the front side of the gallium arsenide substrate a polishing utilizing a chloric polishing agent; and
    a second polishing step, subsequent to the first polishing step, of stopping supply of the chloric polishing agent and carrying out on the at least the front side of the gallium arsenide substrate a polishing operation utilizing an oxidant-free alkaline aqueous solution containing an inorganic builder and having a pH of 8.5 to 13.0 inclusive.

2. A compound semiconductor-substrate polishing method as set forth in claim 1, wherein in said second polishing step the inorganic builder added to the alkaline aqueous solution is composed of at least one substance selected from the group consisting of: sodium hydrate, sodium carbonate, sodium hydrogen carbonate, sodium sesquicarbonate, sodium metasilicate, sodium sesquisilicate, sodium orthosilicate, sodium orthophosphate, sodium pyrophosphate, sodium tripolyphosphate, sodium tetraphosphate, sodium hexametaphosphate, and sodium sulfate.

3. A compound semiconductor-substrate polishing method as set forth in claim 1, wherein the first polishing step and second polishing step are implemented as a final process of planarizing at least the front side of the gallium arsenide substrate.

4. A method of manufacturing a gallium arsenide epitaxial substrate, comprising:
    a process of implementing a compound-semiconductor-substrate polishing method as set forth in claim 1; and
    a post-treatment step, subsequent to said process of implementing the polishing method, of forming an epitaxial layer on at least the front side of the gallium arsenide substrate.

* * * * *